United States Patent
Lee

(10) Patent No.: US 11,930,602 B2
(45) Date of Patent: Mar. 12, 2024

(54) SHELL STRUCTURE AND ELECTRONIC DEVICE WITH SHELL STRUCTURE

(71) Applicant: Chicony Power Technology Co., Ltd., New Taipei (TW)

(72) Inventor: Po-Sheng Lee, New Taipei (TW)

(*) Notice: Subject to any disclaimer, the term of this patent is extended or adjusted under 35 U.S.C. 154(b) by 185 days.

(21) Appl. No.: 17/191,528

(22) Filed: Mar. 3, 2021

(65) Prior Publication Data

US 2022/0240393 A1   Jul. 28, 2022

(30) Foreign Application Priority Data

Jan. 25, 2021 (TW) .................. 110102745

(51) Int. Cl.
*H05K 5/02* (2006.01)
*H05K 5/00* (2006.01)

(52) U.S. Cl.
CPC ......... *H05K 5/0013* (2013.01); *H05K 5/0217* (2013.01)

(58) Field of Classification Search
CPC ............. H05K 5/0013; H05K 5/0217; H05K 7/20445; H05K 9/005
See application file for complete search history.

(56) References Cited

U.S. PATENT DOCUMENTS

| 5,742,478 | A  | * | 4/1998 | Wu ............... H05K 7/20445 361/728 |
| 7,364,437 | B2 |   | 4/2008 | Xu et al. |
| 2007/0070606 | A1 | * | 3/2007 | Guo ............... H05K 9/005 361/714 |
| 2014/0009891 | A1 | * | 1/2014 | Chen ............... H05K 7/2039 361/720 |

FOREIGN PATENT DOCUMENTS

| CN | 200947722 Y | 9/2007 |
| CN | 103379792 A | 10/2013 |
| CN | 106299840 A | 1/2017 |
| JP | 2013055090 A | 3/2013 |
| TW | M265888 U | 5/2005 |
| TW | M271290 U | 7/2005 |
| TW | M429263 U | 5/2012 |
| TW | 201223402 A | 6/2012 |
| TW | 201332425 A | 8/2013 |
| TW | I576037 B | 3/2017 |
| TW | M550486 U | 10/2017 |
| TW | M579842 U | 6/2019 |

* cited by examiner

*Primary Examiner* — Anthony Q Edwards
*Assistant Examiner* — Hung Q Dang
(74) *Attorney, Agent, or Firm* — INNOVATION CAPITAL LAW GROUP, LLP; Vic Lin

(57) ABSTRACT

A shell structure includes a shell and a shielding cover. The shell has an accommodating space, the accommodating space has an inner wall, and the inner wall has a first buckling portion. The shielding cover is arranged in the accommodating space, the shielding cover has an outer wall, the outer wall corresponds to the inner wall, and the outer wall has a second buckling portion corresponding to the first buckling portion. The first buckling portion and the second buckling portion are buckled with each other to limit relative degrees of freedom of the shell and the shielding cover.

2 Claims, 9 Drawing Sheets

SHELL STRUCTURE AND ELECTRONIC DEVICE WITH SHELL STRUCTURE

CROSS-REFERENCE TO RELATED APPLICATION

This non-provisional application claims priority under 35 U.S.C. § 119(a) to Patent Application No. 110102745 filed in Taiwan, R.O.C. on Jan. 25, 2021, the entire contents of which are hereby incorporated by reference.

BACKGROUND

Technical Field

The instant disclosure relates to a shell, and in particular, to a shell structure with a shielding cover.

Related Art

Components of a large number of products on the market are accommodated inside a shell to protect the components from external interference by virtue of the shell. For example, when a product is impacted by an external force (for example, the product falls to the ground or during an impact test of the product), the shell absorbs an impact force to avoid direct impact on the components, thus achieving protection.

Based on the above, although the components can be protected by the shell to avoid direct impact of an external force, an impact force generated at the moment the product is impacted is likely to cause the components to move relative to the shell. As a result, a plurality of components or the component and the shell collide with each other, causing damage to the product. In view of the above, the inventor concentrated on studies, and finally completes the instant disclosure which can effectively overcome the deficiencies of the conventional technology.

SUMMARY

A primary objective of the instant disclosure is to provide a shell structure, which can limit relative degrees of freedom of a shell and a shielding cover and avoid product damage as a result of collisions.

Another objective of the instant disclosure is to provide an electronic device, which can limit relative degrees of freedom of a shell and a shielding cover and avoid product damage as a result of collisions.

To achieve the above objectives, the shell structure of the instant disclosure includes a shell and a shielding cover. The shell has an accommodating space, the accommodating space has an inner wall, and the inner wall has a first buckling portion. The shielding cover is arranged in the accommodating space, and the shielding cover has an outer wall. The outer wall corresponds to the inner wall, and the outer wall has a second buckling portion corresponding to the first buckling portion. The first buckling portion and the second buckling portion are buckled with each other to limit relative degrees of freedom of the shell and the shielding cover. The electronic device of the instant disclosure includes a shell, a shielding cover, and a circuit board. The shell has an accommodating space, the accommodating space has an inner wall, and the inner wall has a first buckling portion. The shielding cover is arranged in the accommodating space, and the shielding cover has an outer wall. The outer wall corresponds to the inner wall, and the outer wall has a second buckling portion corresponding to the first buckling portion. The circuit board is arranged within and enclosed by the shielding cover, and the circuit board and the shielding cover are fixed to each other. The first buckling portion and the second buckling portion are buckled with each other to limit relative degrees of freedom of the shell and the shielding cover.

Based on the above, in the shell structure and the electronic device of the embodiments of the instant disclosure, the first buckling portion of the shell and the second buckling portion of the shielding cover are buckled with each other to limit the relative degrees of freedom of the shell and the shielding cover, so that elements (such as the circuit board) fixed to the shielding cover can be prevented from moving when impacted by an external force, thereby avoiding product damage as a result of collisions between the elements or between the elements and the shell.

DETAILED DESCRIPTION

Figure 1:
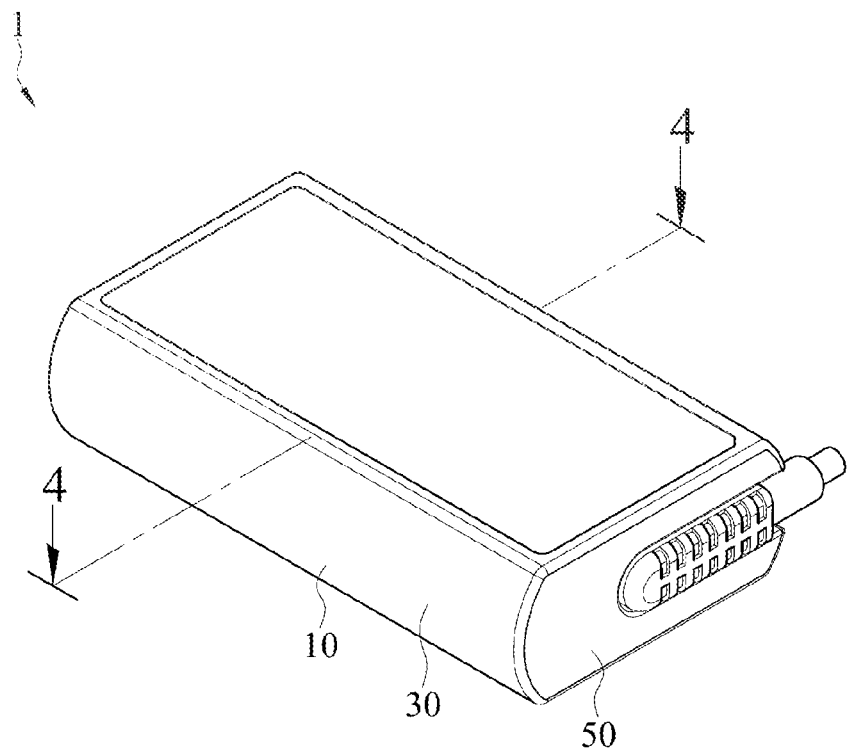
FIG. 1 is a three-dimensional view of an electronic device according to a first embodiment of the instant disclosure.

Various embodiments are described in detail below. However, the embodiments are merely used as examples for description and do not limit or reduce the protection scope of the instant disclosure. In addition, some elements are omitted in the drawings in the embodiments to clearly show the technical features of the instant disclosure. The same reference numeral is used to indicate the same or similar elements in all of the drawings.

Figure 2:
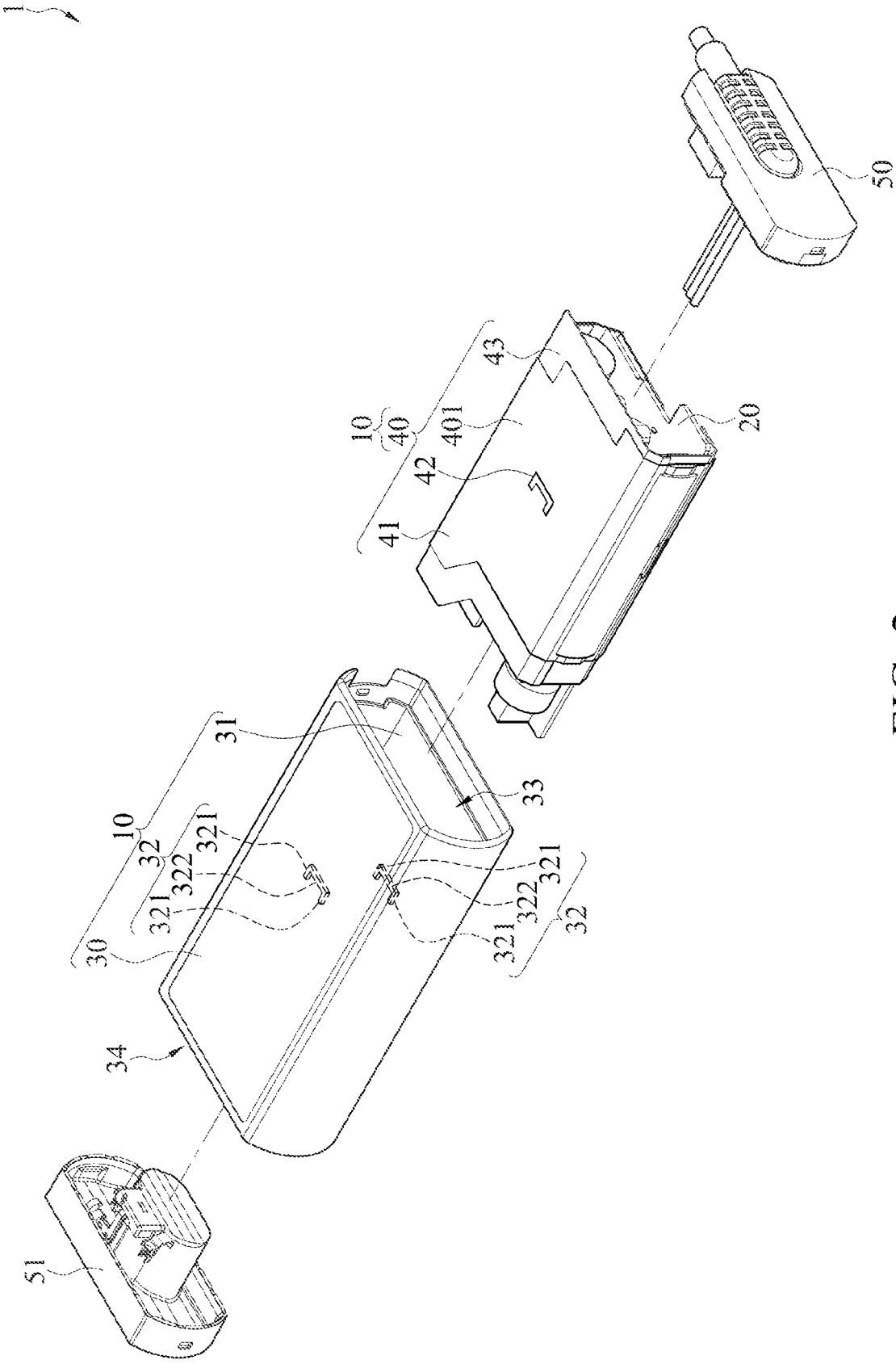
FIG. 2 is a three-dimensional exploded view of the electronic device according to the first embodiment of the instant disclosure.

FIG. 1 is a three-dimensional view of an electronic device according to a first embodiment of the instant disclosure. FIG. 2 is a three-dimensional exploded view of the electronic device according to the first embodiment of the instant disclosure. As shown in FIG. 1 to FIG. 2, an electronic device 1 includes a shell structure 10 and a circuit board 20.

The circuit board 20 is mounted inside the shell structure 10, so that the circuit board 20 can be protected by the shell structure 10.

As shown in FIG. 1 to FIG. 2, the electronic device 1 in this embodiment is a power supply. For example, the power supply may be a switched-mode power supply, a linear power supply, a high-power power supply, a desktop power supply, or the like. Electronic elements such as a battery, a capacitor, a resistor, or the like may be provided on the circuit board 20. In some embodiments, the electronic device 1 may also be a home appliance, a mobile device, or other consumer electronics.

As shown in FIG. 1 to FIG. 2, the shell structure 10 includes a shell 30 and a shielding cover 40. The shell 30 may be a hard shell made of metal, plastic, rubber, other insulators, or the like. The shell 30 is hollowed for accommodating elements in a product, so that the elements are protected from external interference. In some embodiments, an outer shape of the shell 30 may have a square shape, a rectangular shape, an oval shape, a round shape, or other irregular shapes, which is not limited.

As shown in FIG. 1 to FIG. 2, the shell 30 has an accommodating space. The accommodating space has a plurality of inner walls 31, and at least one of the plurality of inner walls 31 has a first buckling portion 32. In this embodiment, the accommodating space has four inner walls 31. Two of the inner walls 31 both have the first buckling portion 32, and the two inner walls 31 having the first buckling portion 32 are located on opposite sides of the accommodating space. In some embodiments, alternatively, the inner walls 31 of the accommodating space each may have a first buckling portion 32, or two adjacent inner walls 31 of the accommodating space have a first buckling portion 32.

As shown in FIG. 1 to FIG. 2, the shielding cover 40 of the shell structure 10 is disposed in the accommodating space of the shell 30. In some embodiments, the shielding cover 40 may be configured to enclose electronic elements in a product to isolate the elements from electromagnetic interference (EMI) generated by other external electrical products. The shielding cover 40 may be made of metal (such as aluminum, copper, iron, cobalt, or the like), other conductive materials, or the like.

Figure 3:
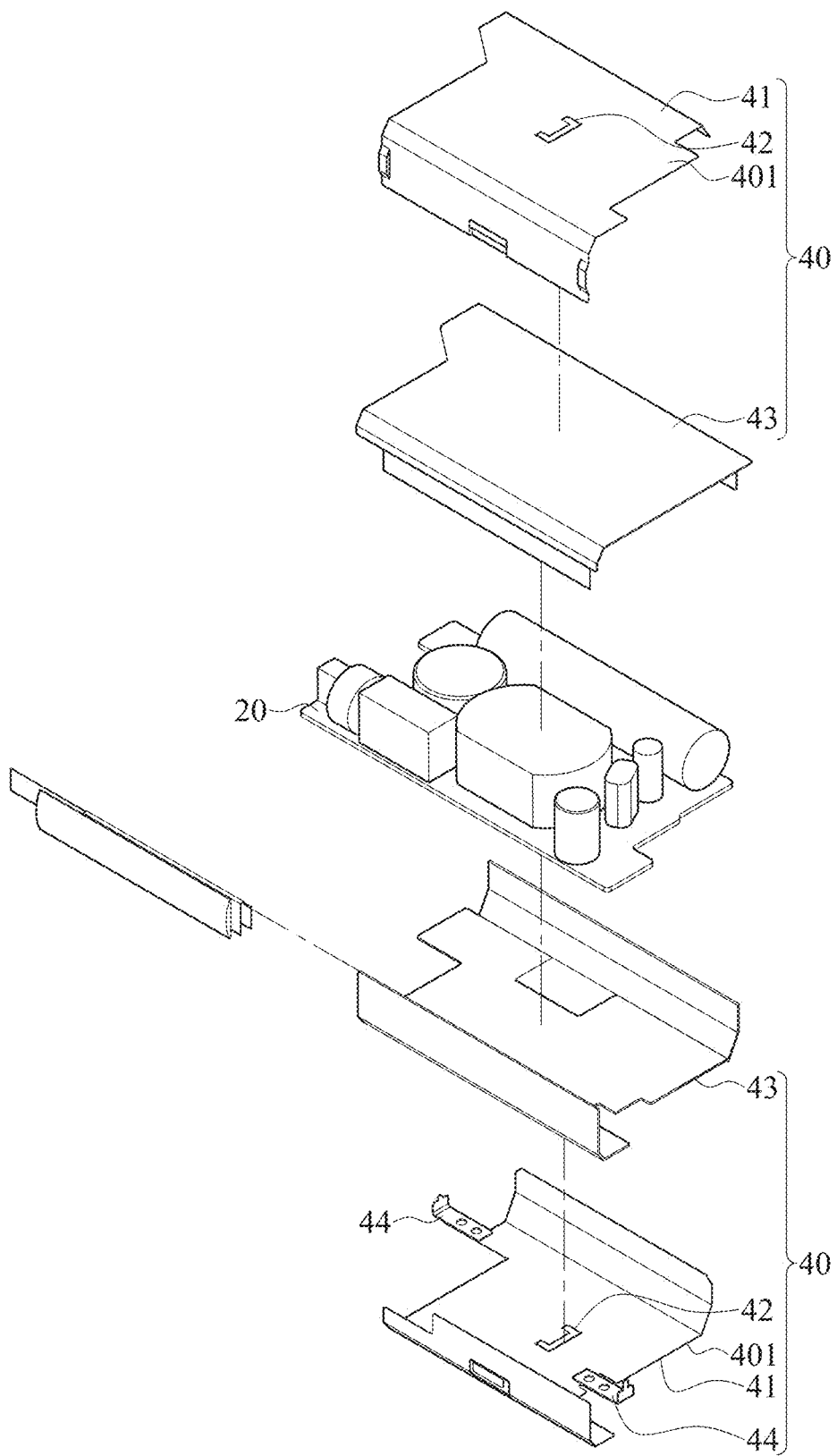
FIG. 3 is a partial three-dimensional exploded view of the electronic device according to the first embodiment of the instant disclosure.

FIG. 3 is a partial three-dimensional exploded view of the electronic device according to the first embodiment of the instant disclosure. As shown in FIG. 1 to FIG. 3, the shielding cover 40 may be an assembled structure. For example, in this embodiment, the shielding cover 40 consists of two U-shaped sheets 401 opposite to each other. One sides of the U-shaped sheets 401 may be assembled through a buckle or in other assembling manners, and the other sides may be engaged through bonding or other fixed engagement. Alternatively, the two sides of each of the U-shaped sheets 401 may also be assembled to each other, which is not limited. The two U-shaped sheets 401 are engaged to form an accommodating space. The circuit board 20 is arranged within the accommodating space of the shielding cover 40 and enclosed by the shielding cover 40. The circuit board 20 and the shielding cover 40 are fixed to each other. In this way, the circuit board 20 is isolated from electromagnetic interference generated by other external electrical products. In some embodiments, the shielding cover 40 may also be integrally formed. For example, the shielding cover 40 may be integrally formed by metal parts or through fixed engagement.

As shown in FIG. 2 to FIG. 3, the shielding cover 40 has a plurality of outer walls 41. At least one of the plurality of outer walls 41 corresponds to the inner wall 31 of the shell 30 having the first buckling portion 32. For example, in this embodiment, two opposite outer walls 41 of the shielding cover 40 are respectively oriented toward the two inner walls 31 having the first buckling portion 32 and correspond to each other, and each of the outer walls 41 of the shielding cover 40 corresponding to each of the inner walls 31 has the second buckling portion 42 corresponding to the first buckling portion 32.

Figure 4:
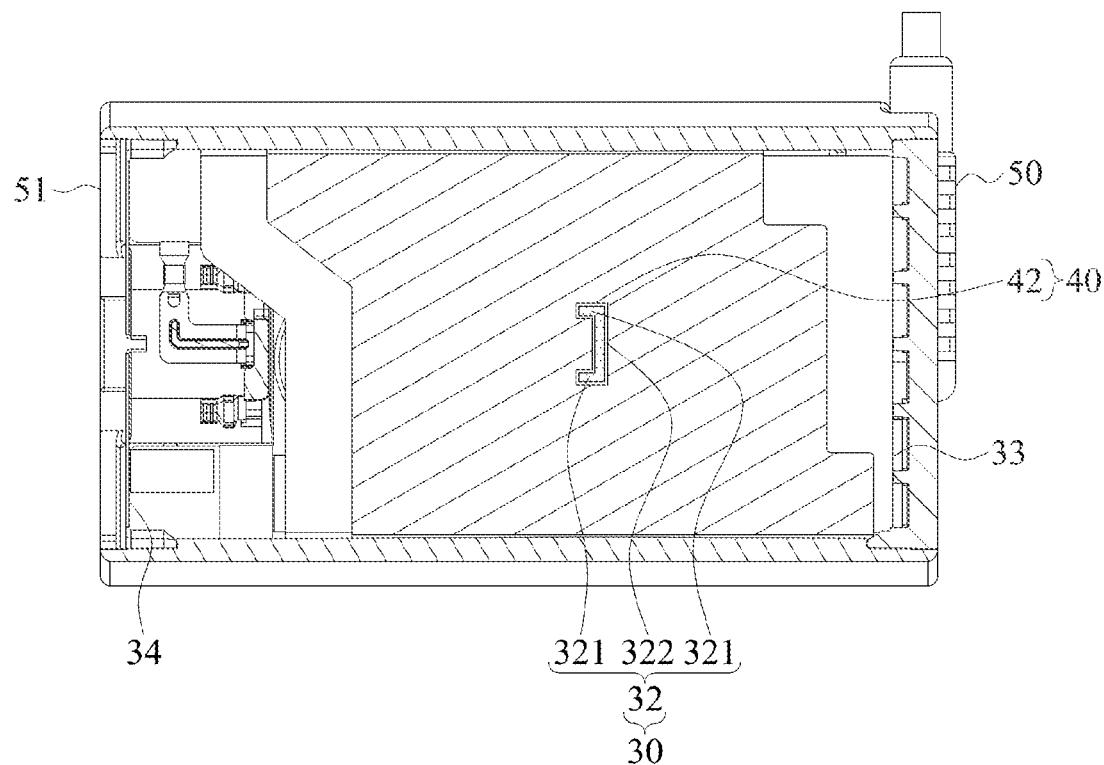
FIG. 4 is a cross-sectional view of the electronic device according to the first embodiment of the instant disclosure.

FIG. 4 is a cross-sectional view of the electronic device according to the first embodiment of the instant disclosure. As shown in FIG. 2 and FIG. 4, in this embodiment, the first buckling portion 32 of the inner wall 31 of the shell 30 and the second buckling portion 42 of the outer wall 41 of the shielding cover 40 are buckled with each other to limit relative degrees of freedom of the shell 30 and the shielding cover 40. In some embodiments, one of the first buckling portion 32 and the second buckling portion 42 is a protrusion, and the other is a recess. The protrusion may be a protruding rib, a post, a bump, a pillar, or the like, and the recess may be a groove, a blind hole, a through hole, or the like. The protrusion or the recess may be integrally formed with the shell 30 or the shielding cover 40 through stamping, casting, injection molding, machining, or the like. Alternatively, the protrusion may be spliced with the shell 30 or the shielding cover 40.

As shown in FIG. 2 and FIG. 4, shapes of the first buckling portion 32 and the second buckling portion 42 match each other. For example, in this embodiment, the first buckling portion 32 includes two short rectangular pillars 321 and one long rectangular pillar 322. The two short rectangular pillars 321 are spaced apart from each other, and the long rectangular pillar 322 is connected between ends of the two short rectangular pillars 321 to form a U-shaped pillar. The second buckling portion 42 of the shielding cover 40 is a U-shaped through hole corresponding to the first buckling portion 32, and a cross-sectional size of the first buckling portion 32 is less than that of the second buckling portion 42, so that the first buckling portion 32 can be accommodated in the second buckling portion 42, and the relative degrees of freedom of the first buckling portion 32 and the second buckling portion 42 are limited by each other. In some embodiments, protrusions or recesses of the first buckling portion 32 and the second buckling portion 42 may also be in other shapes such as an F shape, a C shape, a W shape, a round shape, or the like.

Based on above, in the shell structure 10 and the electronic device 1 of the embodiments of the instant disclosure, the first buckling portion 32 of the shell 30 and the second buckling portion 42 of the shielding cover 40 are buckled with each other to limit the relative degrees of freedom of the shell 30 and the shielding cover 40, so that the circuit board 20 (or other electronic elements) fixed to the shielding cover 40 can be prevented from moving when impacted by an external force, thereby avoiding product damage as a result of collisions between elements or between the elements and the shell 30.

In addition, the first buckling portions 32 are respectively located on two opposite inner walls 31, and the outer walls 41 and the second buckling portions 42 respectively correspond to the inner walls 31 and the first buckling portions 32. Therefore, a buckling force between the shielding cover 40 and the shell 30 can be evenly allocated to the first buckling portions 32 and the second buckling portions 42, further preventing the product from being damaged as a result of an excessively concentrated buckling force.

As shown in FIG. 1 to FIG. 2, in this embodiment, the shell structure 10 further includes a first cover plate 50 and a second cover plate 51. The shell 30 has a first opening 33 and a second opening 34. The first cover plate 50 and the second cover plate 51 respectively cover the first opening 33 and the second opening 34. The first opening 33 and the second opening 34 are respectively located on two opposite sides of the shell 30. The first cover plate 50 and the second cover plate 51 may be respectively fixed to two sides of the shell 30 through ultrasonic welding, locking, buckling, or the like and respectively cover the first opening 33 and the second opening 34. In some embodiments, the first opening 33 and the second opening 34 may also be respectively located on two adjacent surfaces of the shell 30.

Referring to FIG. 1 to FIG. 4, the shape and the size of the first buckling portion 32 of the shell 30 are designed to match the shape and the size of the second buckling portion 42 of the shielding cover 40, to limit relative degrees of freedom of the first buckling portion 32 and the second buckling portion 42 in a direction in which the first opening 33 extends toward the second opening 34. For example, as shown in FIG. 4, in this embodiment, each of the short rectangular pillars 321 of the first buckling portion 32 extends from the first opening 33 toward the second opening 34, and the long rectangular pillar 322 is mated with the second buckling portion 42 to increase a surface contact area of the first buckling portion 32 and the second buckling portion 42 in a direction perpendicular to the direction in which the first opening 33 extends toward the second opening 34, thereby increasing a restraining force in the direction. Moreover, the short rectangular pillar 321 is mated with the second buckling portion 42, so that a support capability of the shell structure 10 in the direction in which the first opening 33 extends toward the second opening 34 could be enhanced.

In this way, by virtue of the matching between the shape and the size of the first buckling portion 32 and the shape and the size of the second buckling portion 42, damage to the first cover plate 50 or the second cover plate 51 or disengagement of the first cover plate 50 or the second cover plate 51 from the shell 30 as a result of collision with the first cover plate 50 or the second cover plate 51 of the shell 30 can be avoided when the circuit board 20 (or other electronic elements) is impacted by an external force. In addition, in terms of design, a space reserved for the circuit board 20 (or other electronic elements) to move inside the shell 30 when impacted can be saved, thereby miniaturizing a volume of the electronic device 1.

Buckling between the first buckling portion 32 of the shell 30 and the second buckling portion 42 of the shielding cover 40 further has a plurality of implementations, which are respectively described below by using mating ways in various embodiments.

Figure 5:
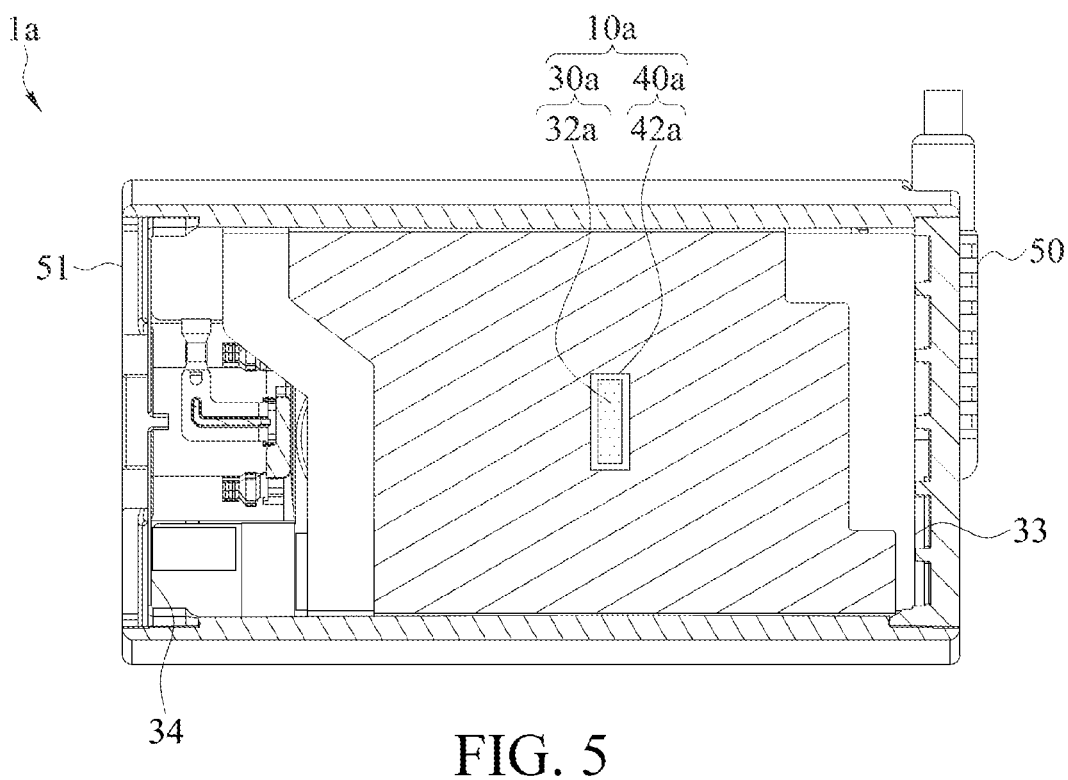
FIG. 5 is a cross-sectional view of an electronic device according to a second embodiment of the instant disclosure.

FIG. 5 is a cross-sectional view of an electronic device according to a second embodiment of the instant disclosure. A difference between this embodiment and the first embodiment as follows. In this embodiment, as shown in FIG. 5, a first buckling portion 32a of a shell 30a is a long rectangular pillar, and a second buckling portion 42a of the shielding cover 40a is a long rectangular through hole. Since the first buckling portion 32a and the second buckling portion 42a are linear shapes, which require no cumbersome processing for formation, manufacturing costs of a shell structure 10a can be reduced, thereby reducing production costs of the electronic device 1a. In some embodiments, the first buckling portion 32a and the second buckling portion 42a may also be respectively a recess and a protrusion, which depends on product requirements and is not limited.

Figure 6:
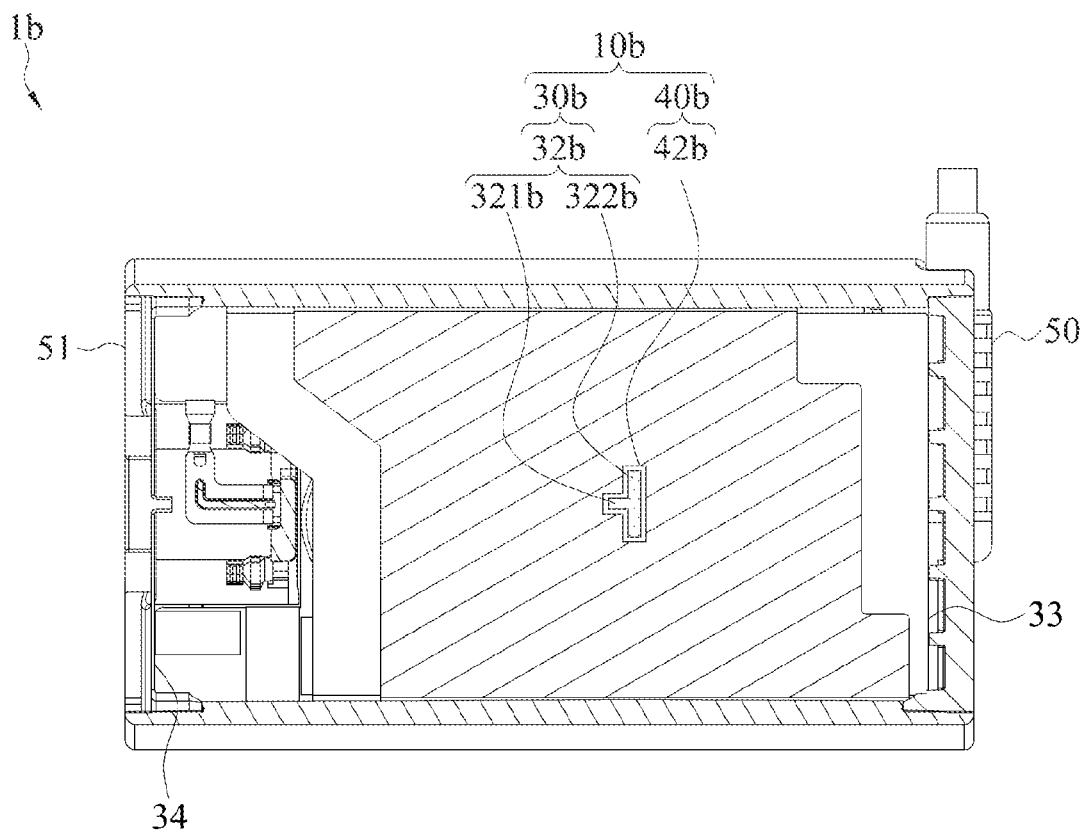
FIG. 6 is a cross-sectional view of an electronic device according to a third embodiment of the instant disclosure.

FIG. 6 is a cross-sectional view of an electronic device according to a third embodiment of the instant disclosure. A difference between this embodiment and the second embodiment is as follows. In this embodiment, as shown in FIG. 6, a first buckling portion 32b of a shell 30b includes a long rectangular pillar 322b and a short rectangular pillar 321b. The short rectangular pillar 321b extends in a direction from the first opening 33 toward the second opening 34 from a middle part of the long rectangular pillar 322b to form a T-shaped pillar. The second buckling portion 42b of the shielding cover 40b is a T-shaped through hole corresponding to the first buckling portion 32b. Since the first buckling portion 32b has one more short rectangular pillar 321b than that in the second embodiment, manufacturing yields and support capabilities of the shell structure 10b and the electronic device 1b are improved. In some embodiments, the first buckling portion 32b and the second buckling portion 42b may also be respectively a recess and a protrusion, which depends on product requirements and is not limited.

Figure 7:
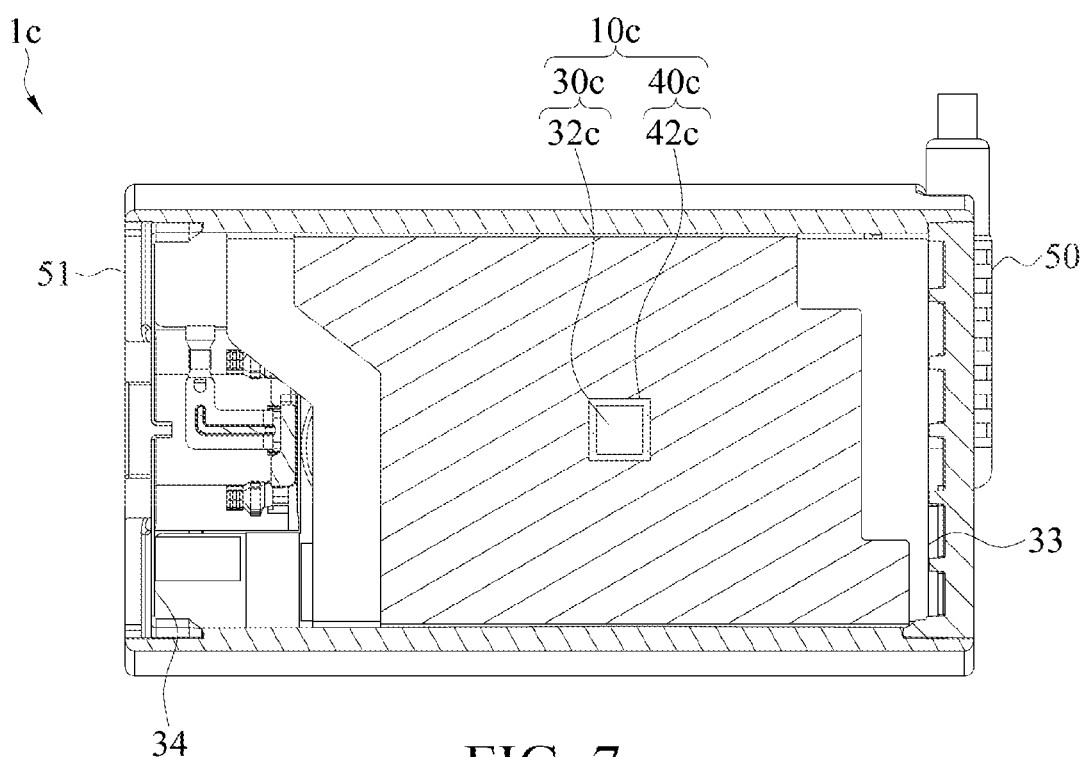
FIG. 7 is a cross-sectional view of an electronic device according to a fourth embodiment of the instant disclosure.

FIG. 7 is a cross-sectional view of an electronic device according to a fourth embodiment of the instant disclosure. A difference between this embodiment and the second embodiment is as follows. In this embodiment, as shown in FIG. 7, a first buckling portion 32c of a shell 30c is a square pillar, and a second buckling portion 42c of the shielding cover 40c is a square through hole corresponding to the first buckling portion 32c. Since shapes and sizes of the first buckling portion 32c and the second buckling portion 42c are more evenly distributed than those in the second embodiment, a support capability of the shell structure 10c can be improved, thereby increasing a yield of the electronic device 1c. In some embodiments, the first buckling portion 32c and the second buckling portion 42c may also be respectively a recess and a protrusion, which depends on product requirements and is not limited.

Figure 8:
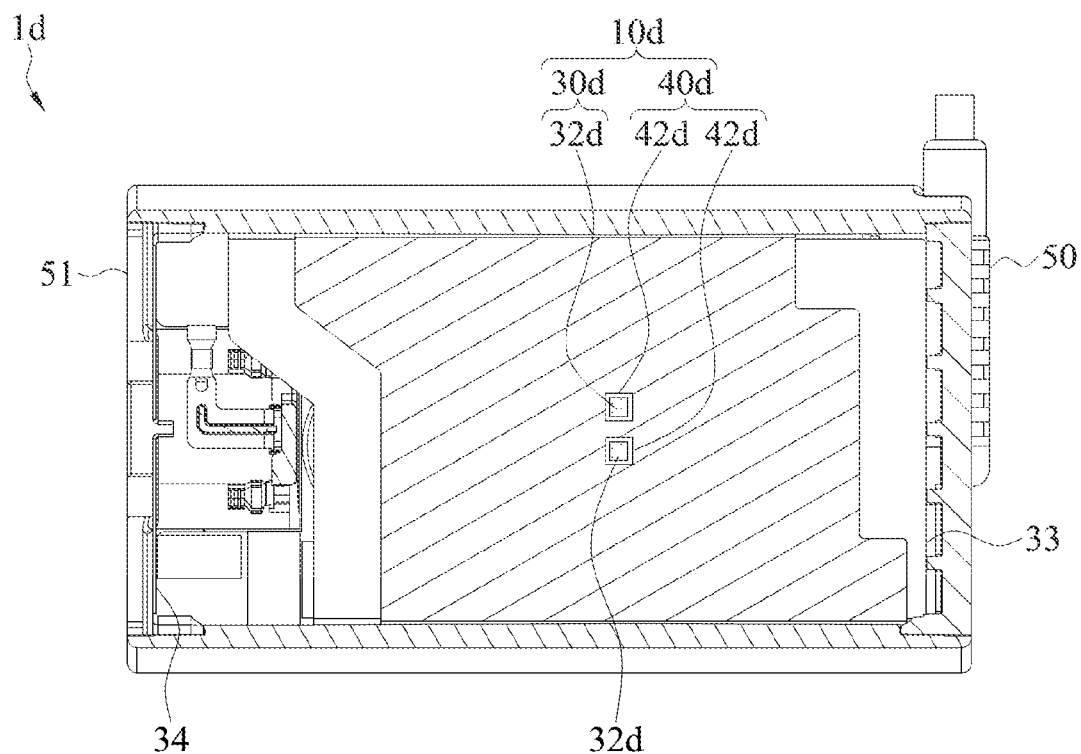
FIG. 8 is a cross-sectional view of an electronic device according to a fifth embodiment of the instant disclosure.

FIG. 8 is a cross-sectional view of an electronic device according to a fifth embodiment of the instant disclosure. A difference between this embodiment and the above embodiments is as follows. In this embodiment, as shown in FIG. 8, a first buckling portion 32d of a shell 30d includes two side-by-side square pillars, and a second buckling portion 42d of the shielding cover 40d is two side-by-side square through holes corresponding to the first buckling portion 32d. Since the shapes and sizes of the first buckling portion 32d and the second buckling portion 42d are smaller than those in the above embodiments, materials used for manufacturing of the shell 30d can be reduced, thereby reducing production costs of the shell structure 10d and the electronic device 1d. In some embodiments, the first buckling portion 32d and the second buckling portion 42d may also be respectively a recess and a protrusion, which depends on product requirements and is not limited.

Figure 9:
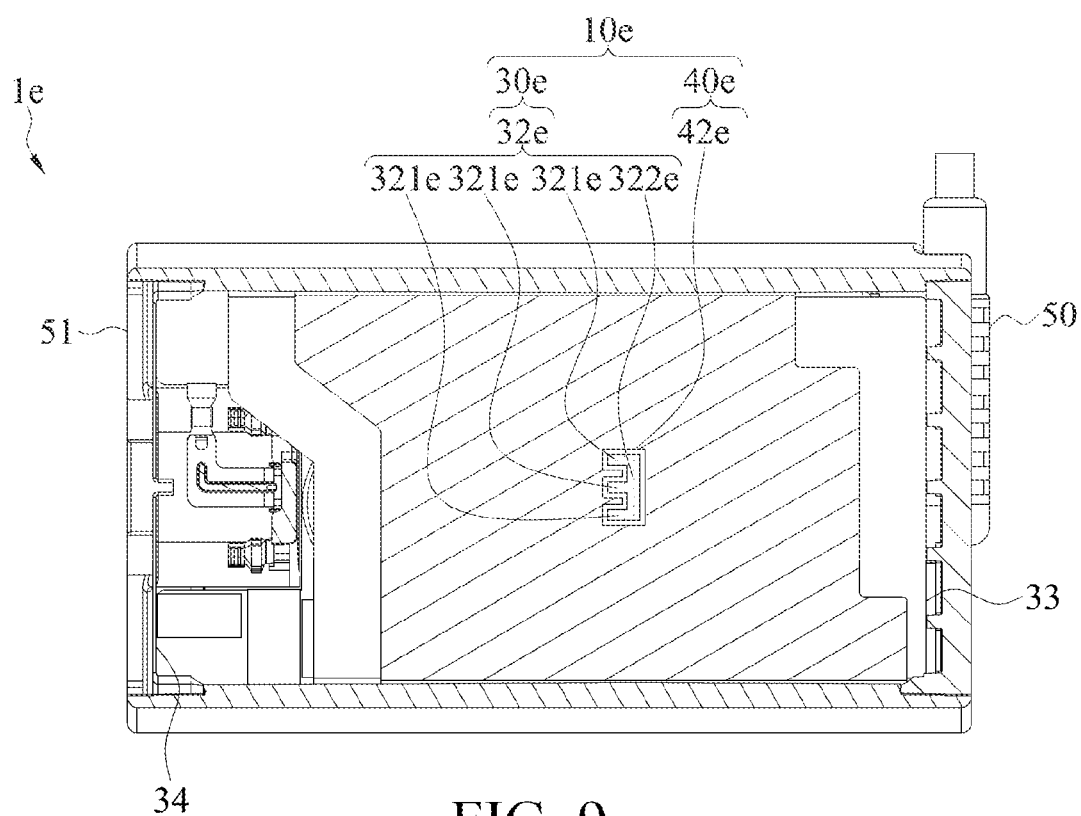
FIG. 9 is a cross-sectional view of an electronic device according to a sixth embodiment of the instant disclosure.

FIG. 9 is a cross-sectional view of an electronic device according to a sixth embodiment of the instant disclosure. A difference between this embodiment and the first embodiment is as follows. In this embodiment, as shown in FIG. 9, a first buckling portion 32e of a shell 30e includes three side-by-side short rectangular pillars 321e and one long rectangular pillar 322e. The long rectangular pillar 322e is connected between ends of the short rectangular pillars 321e to form an E-shaped pillar. A second buckling portion 42e of the shielding cover 40e is an E-shaped through hole corresponding to the first buckling portion 32e. Since the first buckling portion 32e has one more short rectangular pillar 321e than that in the above first embodiment, a support capability of the shell structure 10e can be improved, thereby increasing a yield of the electronic device 1e. In some embodiments, the first buckling portion 32e and the second buckling portion 42e may also be respectively a recess and a protrusion, which depends on product requirements and is not limited.

Figure 10:
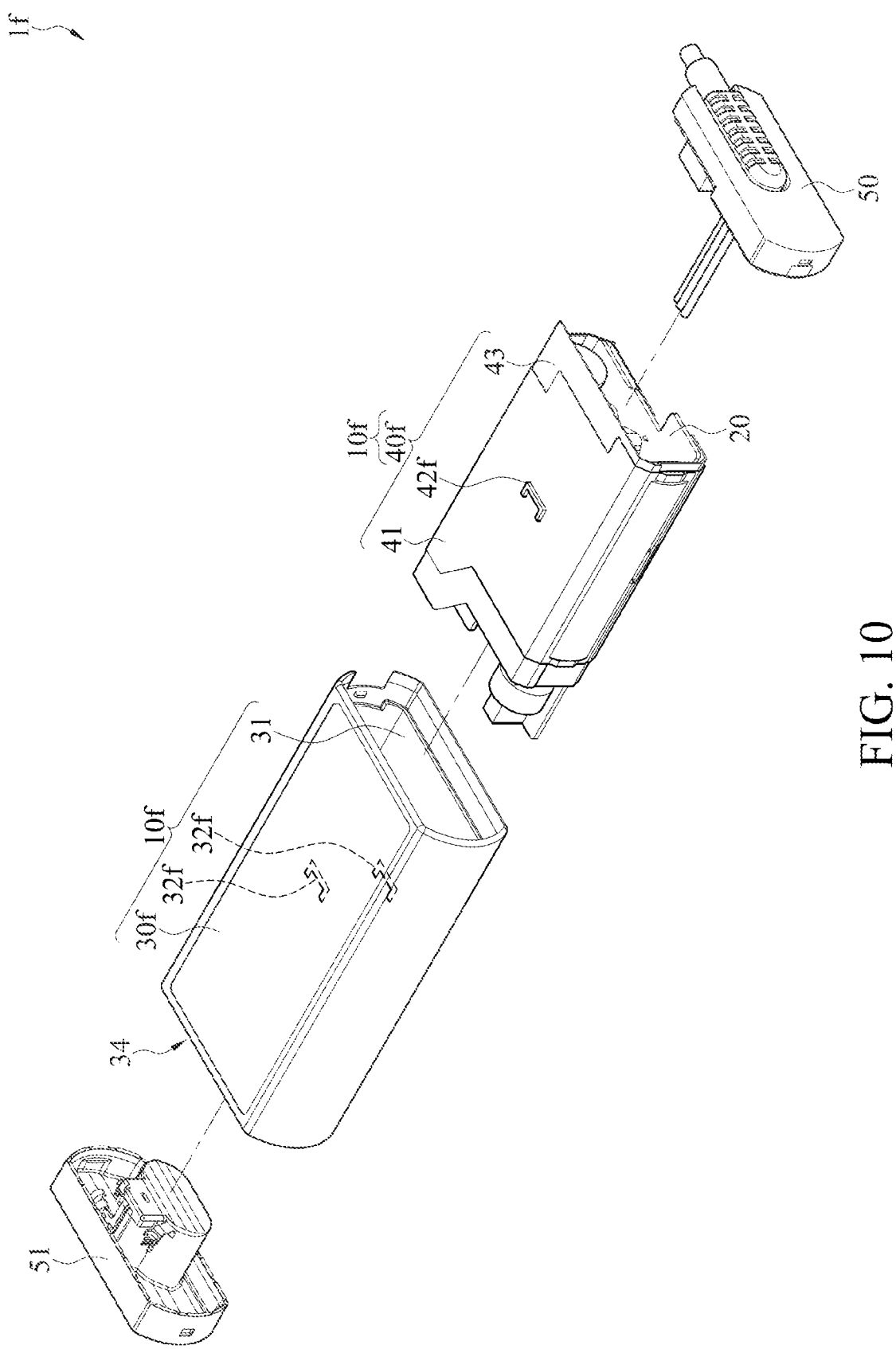
FIG. 10 is a three-dimensional exploded view of an electronic device according to a seventh embodiment of the instant disclosure.
Figure 11:
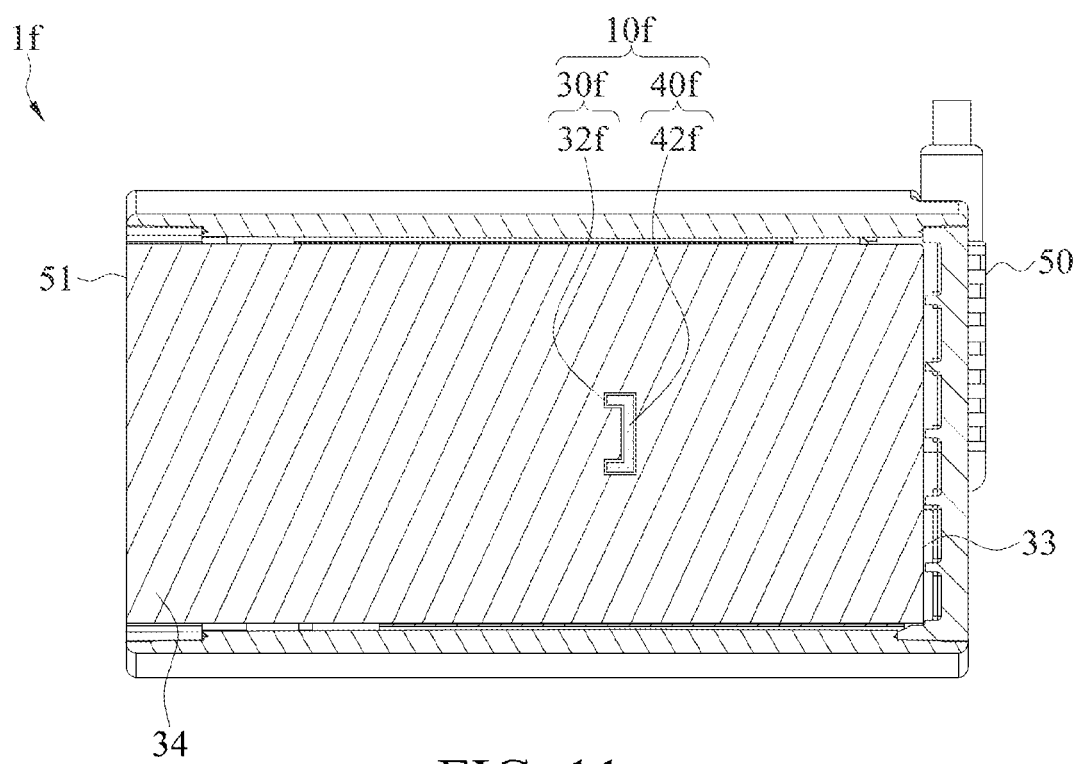
FIG. 11 is a cross-sectional view of the electronic device according to the seventh embodiment of the instant disclosure.

FIG. 10 is a three-dimensional exploded view of an electronic device according to a seventh embodiment of the instant disclosure. FIG. 11 is a cross-sectional view of an electronic device according to a seventh embodiment of the instant disclosure. As shown in FIG. 10 to FIG. 11, a difference between this embodiment and the first embodiment is as follows. In this embodiment, a first buckling portion 32f of a shell 30f is a U-shaped groove, and a second buckling portion 42f of the shielding cover 40f is a U-shaped pillar. Cross-sectional shapes of the first buckling portion 32f and the second buckling portion 42f match with each other, and a cross-sectional size of the first buckling portion 32f is greater that of the second buckling portion 42f, so that the first buckling portion 32f can be accommodated in the second buckling portion 42f, and relative degrees of freedom of the first buckling portion 32f and the second buckling portion 42f are limited by each other.

Therefore, in the shell structure 10f and the electronic device if in this embodiment, the first buckling portion 32f of the shell 30f and the second buckling portion 42f of the shielding cover 40f are respectively set as a recess and a protrusion. A plurality of design techniques are provided to meet different usage requirements.

Figure 12:
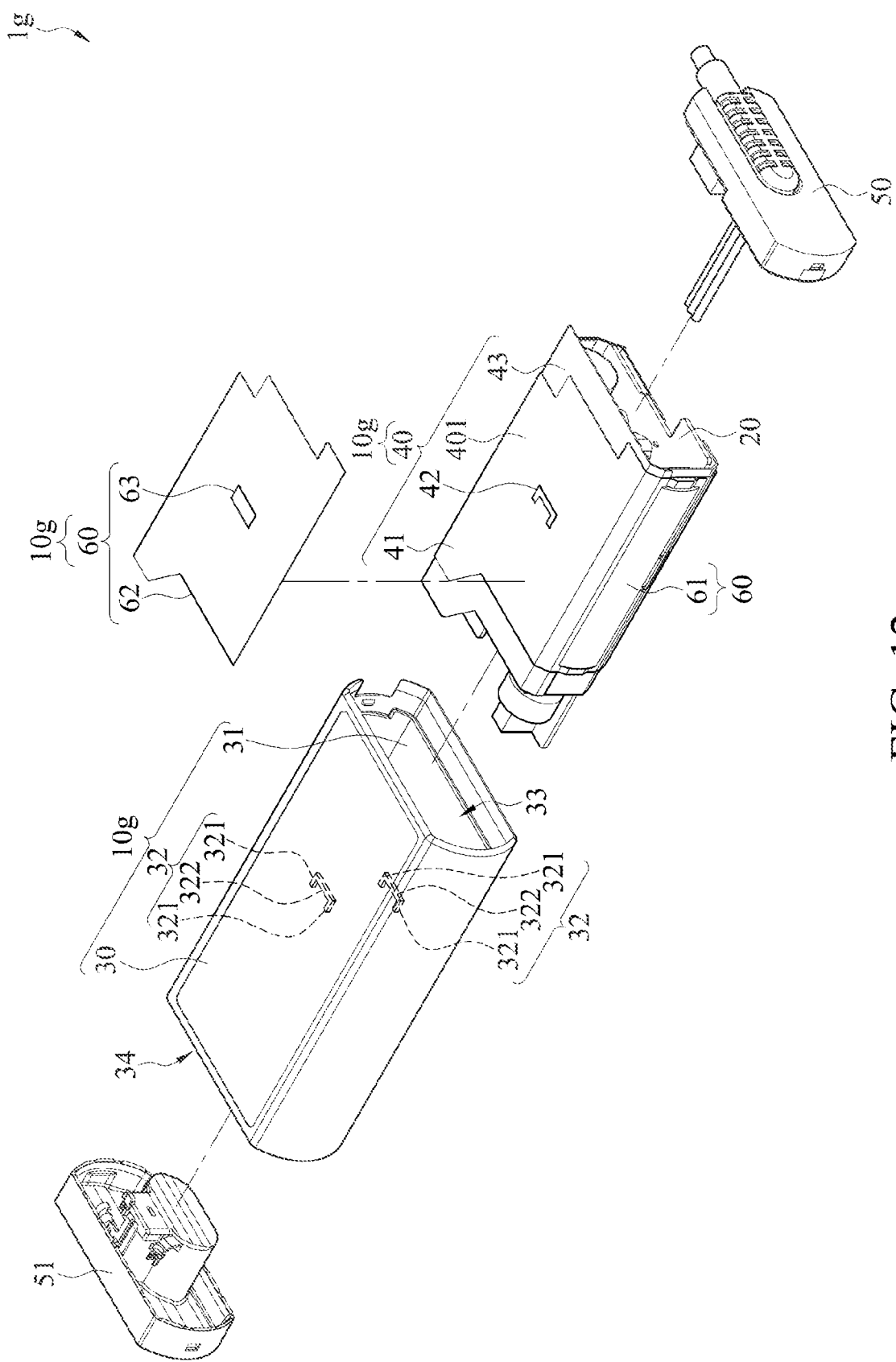
FIG. 12 is a three-dimensional exploded view of an electronic device according to an eighth embodiment of the instant disclosure.

FIG. 12 is a three-dimensional exploded view of an electronic device according to an eighth embodiment of the instant disclosure. A difference between the eighth embodiment and the first embodiment is as follows. As shown in FIG. 2 and FIG. 12, in this embodiment, a shell structure 10g of the electronic device 1g further includes a heat sink 60. The heat sink 60 is made of, for example, metal, aluminum, copper, ceramics, or the like through stamping, casting, or the like, and the heat sink 60 is fixed to the shielding cover 40 through bonding, locking, riveting, welding, or the like.

Based on the above, as shown in FIG. 12, in this embodiment, the heat sink 60 includes a heat sink 61 and a heat sink 62. The heat sink 61 and the heat sink 62 are respectively fixed on two adjacent outer walls 41 of a shielding cover 40. The heat sink 61 and the heat sink 62 are respectively located between an inner wall 31 of a shell 30 and an outer wall 41 of the shielding cover 40, and the heat sink 62 has a positioning portion 63. The positioning portion 63 of the heat sink 62 corresponds to a first buckling portion 32 and a second buckling portion 42. For example, in this embodiment, the positioning portion 63 of the heat sink 62 is a rectangular through hole, and is sleeved on the first buckling portion 32 together with the second buckling portion 42. In some embodiments, the positioning portion 63 of the heat sink 62 may also be a circular through hole, an oval through hole, a square through hole, or other through holes, and the instant disclosure is not limited to the shapes.

In some embodiments, the heat sink 60 may also be fixed on and enclosed by all outer walls 41 of the shielding cover 40, or the heat sink 60 may be fixed on and enclosed by only one of the outer walls 41 of the shielding cover 40, which depends on heat dissipation requirements of the electronic device 1 and is not limited.

Therefore, the heat sink 60 is fixed to the shielding cover 40, and the heat sink 60 is located between the shielding cover 40 and the shell 30, so that heat energy generated by the circuit board 20 (or other heating elements) enclosed by the shielding cover 40 can be dissipated to outside of the shell 30 through the heat sink 60, thereby achieving heat dissipation. In addition, the positioning portion 63 of the heat sink 62 corresponds to the first buckling portion 32 and the second buckling portion 42 to strengthen a restraining force of the heat sink 62 and the shielding cover 40, so that the heat sink 62 fixed to the shielding cover 40 can be prevented from moving when impacted by an external force, thereby closely attaching the heat sink 62 and the shielding cover 40 to each other. In this way, a heat dissipation capacity of the product can still remain under an improper operation.

As shown in FIG. 2 to FIG. 3, in this embodiment, the shielding cover 40 further includes two opposite insulating sheets 43. Each of the insulating sheets 43 may be fixed on an inner surface of each of the U-shaped sheets 401 through bonding, riveting, locking, or the like. The insulating sheet 43 is made of, for example, rubber, plastic, cotton yarn, ceramics, or the like. The insulating sheet 43 may be manufactured through stamping, casting, or the like. In some embodiments, the insulating sheet 43 may also be fixed on only the inner surface of one of the U-shaped sheets 401, which depends on product requirements and is not limited. Furthermore, two hook structures 44 are disposed on two sides of one of the U-shaped sheets 401 to abut the circuit board 20 and the insulating sheets 43 to prevent the circuit board 20 and the insulating sheets 43 from sliding and contacting the first cover plate 50 and a second cover plate 51.

Although the instant disclosure has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A shell structure, comprising:
a shell having an accommodating space, a first opening and a second opening, wherein the accommodating space has an inner wall, and the inner wall has two first buckling portions, and the inner wall has two first buckling portions, the first opening and the second opening are two ends of the accommodating space;
an EMI shielding cover arranged in the accommodating space and having two U-shaped outer walls assembled to each other, wherein the U-shaped outer walls correspond to the inner wall, and each of the outer walls has a second buckling portion corresponding to one of the first buckling portions, one of the first buckling portion and the second buckling portion is a protrusion, and the other is a recess;
two insulating sheets fixed in the inner side of the U-shaped outer walls respectively;
two hook structures disposed on two sides of one of U-shaped outer walls, and adjacent to the first opening and the second opening, wherein the hook structures abut the two insulating sheets;
a heat sink fixed to the EMI shielding cover and located between the inner wall and the outer wall, wherein the heat sink has a positioning portion corresponds to one of first buckling portions and one of second buckling portions; and
a first cover plate and a second cover plate, the first cover plate and the second cover plate assembled to the periphery wall of the first opening and the second opening respectively and close the first opening and the second opening;

wherein the first buckling portion and the second buckling portion are buckled with each other to limit relative degrees of freedom of the shell and the EMI shielding cover, and the heat sink has a positioning portion corresponding to the first buckling portion and the second buckling portion.

2. An electronic device, comprising:

a shell having an accommodating space, a first opening and a second opening, wherein the accommodating space has an inner wall, and the inner wall has two first buckling portions, and the inner wall has two first buckling portions, the first opening and the second opening are two ends of the accommodating space;

an EMI shielding cover arranged in the accommodating space and having two U-shaped outer walls assembled to each other, wherein the U-shaped outer walls correspond to the inner wall, and each of the outer walls has a second buckling portion corresponding to one of the first buckling portions, one of the first buckling portion and the second buckling portion is a protrusion, and the other is a recess;

two insulating sheets fixed in the inner side of the U-shaped outer walls respectively;

a heat sink fixed to the EMI shielding cover and located between the inner wall and the outer wall, wherein the heat sink has a positioning portion corresponds to one of first buckling portions and one of second buckling portions;

a circuit board arranged within and enclosed by the EMI shielding cover, wherein the circuit board and the EMI shielding cover are fixed to each other;

two hook structures disposed on two sides of one of U-shaped outer walls, and adjacent to the first opening and the second opening, wherein the hook structures abut the two insulating sheets and the circuit board; and a first cover plate and a second cover plate, the first cover plate and the second cover plate assembled to the periphery wall of the first opening and the second opening respectively and close the first opening and the second opening;

wherein the first buckling portion and the second buckling portion are buckled with each other to limit relative degrees of freedom of the shell and the EMI shielding cover, and the heat sink has a positioning portion corresponding to the first buckling portion and the second buckling portion.

* * * * *